United States Patent
Berens et al.

(12) 
(10) Patent No.: US 10,050,639 B1
(45) Date of Patent: Aug. 14, 2018

(54) PARTIALLY ASYNCHRONOUS CLOCK SCHEME FOR SAR ADC

(71) Applicant: NXP USA, Inc., Austin, TX (US)

(72) Inventors: Michael T. Berens, Austin, TX (US); Khoi B. Mai, Austin, TX (US); George E. Baker, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/825,838

(22) Filed: Nov. 29, 2017

(51) Int. Cl.
   *H03M 1/46* (2006.01)
   *H03M 1/68* (2006.01)
   *H03M 1/10* (2006.01)
   *H03M 1/06* (2006.01)

(52) U.S. Cl.
   CPC ......... *H03M 1/462* (2013.01); *H03M 1/0697* (2013.01); *H03M 1/1061* (2013.01); *H03M 1/468* (2013.01); *H03M 1/687* (2013.01)

(58) Field of Classification Search
   None
   See application file for complete search history.

(56) References Cited

U.S. PATENT DOCUMENTS

| | | | |
|---|---|---|---|
| 8,134,487 B2 * | 3/2012 | Harpe | H03M 1/125 341/155 |
| 8,344,925 B1 | 1/2013 | Evans | |
| 8,659,463 B2 | 2/2014 | Cho et al. | |
| 8,786,483 B1 | 7/2014 | Thompson et al. | |
| 8,896,476 B2 * | 11/2014 | Harpe | H03M 1/0697 341/118 |
| 9,197,231 B1 | 11/2015 | Feddeler et al. | |
| 9,197,238 B1 | 11/2015 | Nagaraj et al. | |
| 9,258,008 B2 | 2/2016 | Singh et al. | |
| 9,379,726 B1 | 6/2016 | Wang et al. | |
| 9,413,378 B2 | 8/2016 | Fogleman et al. | |
| 9,484,945 B1 | 11/2016 | Wan et al. | |
| 9,509,329 B2 | 11/2016 | Baek et al. | |
| 9,577,660 B1 | 2/2017 | Kang | |
| 9,614,540 B1 | 4/2017 | Kull et al. | |
| 9,660,664 B1 * | 5/2017 | Price | H03M 1/125 |

(Continued)

OTHER PUBLICATIONS

Chen et al., A 6-bit 600-MS/s 5.3-mW Asynchronous ADC in 0.13 micrometer CMOS, IEEE Journal of Solid-State Circuits, vol. 41, No. 12, Dec. 2006.*

(Continued)

*Primary Examiner* — Howard Williams (57) ABSTRACT

A method and apparatus are provided for controlling an SAR ADC by generating a first signal to control sampling of an analog input voltage at a DAC, and then generating a second signal to start a successive approximation sequence at a comparator and SAR engine to convert the analog input voltage to an N-bit digital value, where the successive approximation sequence includes a settling phase for each bit of the N-bit digital value and is controlled to synchronously end in response to a first synchronous clock signal, and also includes a comparison phase for each bit of the N-bit digital value to allow for comparison of the analog input voltage to a reference voltage, where each comparison phase is controlled to synchronously start in response to the first synchronous clock signal and asynchronously end in response to a second asynchronous clock signal that is self-generated by the comparator.

20 Claims, 6 Drawing Sheets

(56) References Cited

U.S. PATENT DOCUMENTS

2010/0079327 A1  4/2010 Berens et al.
2013/0249723 A1  9/2013 Dey et al.
2015/0318862 A1  11/2015 Feddeler et al.

OTHER PUBLICATIONS

Pieter J.A. Harpe et al., "A 26uW 8 bit 10 MS/s Asynchronous SAR ADC for Low Energy Radios," IEEE Journal of Solid-State Circuits, vol. 46, No. 7, Jul. 2011.
Kapusta et al., "A 14b 80 MS/s SAR ADC With 73.6 dB SNDR in 65 nm CMOS," IEEE Journal of Solid-State Circuits, vol. 48, No. 12, Dec. 2013.
F. Kuttner, "A 1.2V I0b 20 M Samples/s Non-Binary Successive Approximation ADC in 0.13pm CMOS," ISSCC Dig. Tech. Papers, pp. 176-177, Feb. 2002.
S. Shimokura et al., "Conversion Rate Improvement of SAR ADC with Digital Error Correction," IEEJ International Analog VLSI Workshop, Limerick, Ireland (Nov. 2007).
M. Hesener et al., "A 14b 40MS/s Redundant SAR ADC with 480MHz Clock in 0.13μmCMOS," Tech. Digest of ISSCC (Feb. 2007).

* cited by examiner

PARTIALLY ASYNCHRONOUS CLOCK SCHEME FOR SAR ADC

BACKGROUND OF THE INVENTION

Field of the Invention

The present invention is directed in general to electrical circuitry for data conversion. In one aspect, the present invention relates generally to analog-to-digital converter (ADC) systems.

Description of the Related Art

In electronics, an analog-to-digital converter (ADC, A/D, or A-to-D) is a system that converts an analog signal into a digital signal. A successive approximation register (SAR) ADC is a type of analog-to-digital converter that converts a continuous analog waveform into a discrete digital representation via a binary search. During this binary search, the ADC makes a decision for each bit of resolution, thus converging upon a digital output for each conversion. SAR ADCs can be designed as fully synchronous, using a fixed time for each bit decision based on an input clock, or asynchronous, having variable time for each bit decision based on a self-timed comparator delay. As will be appreciated, there are advantages and disadvantages associated with synchronous and asynchronous SAR ADCs. For example, fully synchronous SAR ADCs typically require an over-sampling clock that is a multiple of the ADC sample frequency, and are designed on the basis of a fixed DAC settling time and fixed compare times, in which case the clock frequency must be chosen to meet the worst case combination of those delays, thereby reducing the overall speed of data conversion operations. And with fully synchronous SAR ADCs, it is also difficult to optimize for compare vs DAC settling time without duty cycle adjustments or higher frequency clocks. In contrast, fully asynchronous SAR ADCs are much faster and do not require a fast input clock, but there are design complexities and performance drawbacks for asynchronous ADCs which typically require that an analog delay be generated in order to match the worst case DAC settling time. Designing this delay adds power and complexity and likely requires some trimming/calibration. In addition, the difficulty in knowing the end of the conversion time with asynchronous converters typically requires that the input clock rate be chosen for worst case approximation times, thereby sacrificing some of the speed performance advantages that would otherwise accrue for a fully asynchronous SAR ADC.

As seen from the foregoing, the existing SAR ADC solutions for quickly and efficiently performing analog-to-digital conversions are extremely difficult at a practical level by virtue of the difficulty balancing the design constraints for providing an efficient, low complexity SAR ADC with the performance demands for performing high speed analog-to-digital conversion. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A system, apparatus, and methodology are described for providing a partially asynchronous clocking scheme in an SAR ADC which uses asynchronous compare times within a fixed period for the "compare time plus DAC settling time" to increase the ADC conversion speed without requiring analog delay circuitry. In selected embodiments, the asynchronous compare times are controlled with a clocking scheme which uses a synchronous comparator input clock (e.g., dyn_clk) to end the settling time and initiate the compare timing and uses asynchronous self-generated clock edges (e.g., clkd) to end the compare timing and begin the settling time of the next bit, thereby adjustably controlling the settling and comparison timing during each successive approximation phase while maintaining a fixed period for the "compare time plus DAC settling time." In particular, a disclosed synchronous ADC input clock edge begins each compare phase (and ends the preceding settling phase) and an asynchronous, self-generated clock edge ends each compare phase and begins the DAC settling phase to begin the next bit approximation. By using the ADC input clock to synchronously initiate the compare phase and using the self-generated clock edge to asynchronously end the compare phase, the compare phase timing can be reduced, thereby providing more time for the DAC settling time compared to a synchronous ADC and allowing the clock rate to be increased. In selected embodiments, a single OR logic gate may be included in the comparator to generate the asynchronous, self-generated clock edge (clkd) to significantly increase the conversion speed (e.g., approximately 2-2.5 times faster as compared to conventional synchronous ADCs). By using a partially asynchronous clock scheme where the compare time plus DAC settling time is fixed, the comparator takes only the time required for comparison and the rest of the cycle is allowed for settling time for logic delays, DAC settling, and pre-amp settling. In this way, some of the speed benefits of a fully asynchronous architecture can be achieved without the added complexity of creating and calibrating analog delays.

Figure 1:
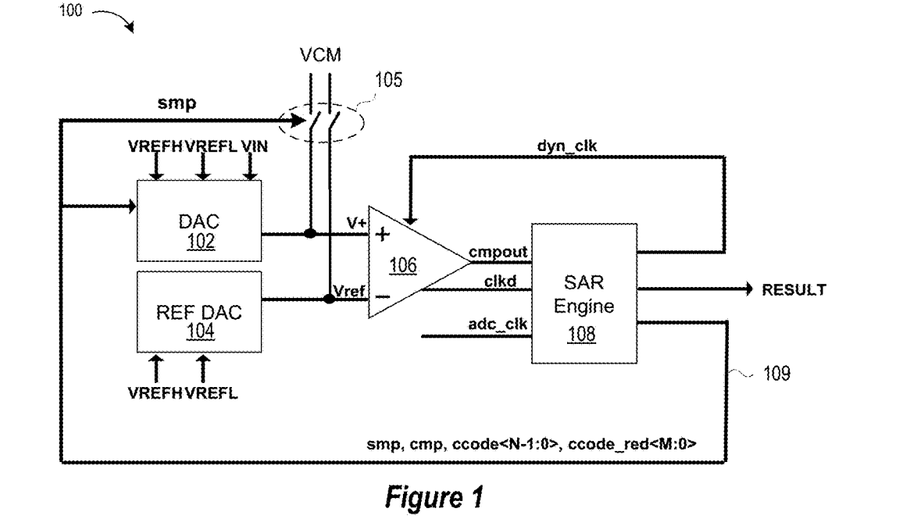
FIG. 1 depicts a schematic block diagram illustrating an SAR ADC in accordance with selected embodiments of the present disclosure.

To provide a contextual understanding for selected embodiments of the present disclosure, reference is now made to FIG. 1 which shows a schematic block circuit diagram illustrating an SAR ADC system 100 in accordance with selected single-ended embodiments. The system 100 includes first and second digital-to-analog converters (DAC) 102, 104, each of which may be embodied with a capacitor array. The DACs 102, 104 are connected, respectively, to the non-inverting and inverting inputs of a single-ended comparator 106 which are pre-charged to a common mode voltage (VCM) by the switching circuit 105 which may be controlled by the feedback comparison control signal (e.g., smp). The comparator 106 generates a comparator output (cmpout) and self-generated clock (clkd) that are connected to an SAR engine 108 which may be configured as a sequencer that initially generates the sampling and comparison control signals (e.g., smp, cmp) for controlling the DAC 102 to control the sampling of the input voltage VIN in response to the received input clock (adc_clk) and self-generated clock (clkd). In addition, the SAR engine 108 is also configured to generate a synchronous input clock (dyn_clk) for feedback to the comparator 106 to begin each compare phase, and to respond to the asynchronous self-generated clock (clkd) from the comparator 106 to end each compare phase.

In operation, the single-ended SAR ADC system 100 converts a received analog input voltage (VIN) to a corresponding binary value having a resolution of n bits in which "n" is a positive integer greater than 1. At the DAC 102, the analog input voltage VIN is initially sampled during a sampling phase with a capacitor array (not shown) which includes a plurality of binary weighted capacitors, while the output of DAC 102 (the top plate of the binary weighted capacitors) is pre-charged to a common mode voltage (VCM) via switching circuit 105. As will be appreciated by those skilled in the art, each binary weighted capacitor corresponds to a binary digit of the binary value obtained from the ADC. The bottom plates of the binary weighted capacitors may be switched between a first voltage VREFH, a second voltage VREFL, and a third voltage VIN, where VREFL≤VIN≤VREFH. In similar fashion, the reference DAC 104 is connected to receive the first and second reference voltages VREFH, VREFL. DAC 104 may be a full copy of the binary weighted array or a partial copy that sufficiently matches DAC 102. The bottom plates of capacitors in DAC 104 are not altered during the conversion, thus maintaining output reference voltage Vref near VCM for connection to the inverting input of the comparator 106.

Figure 2:
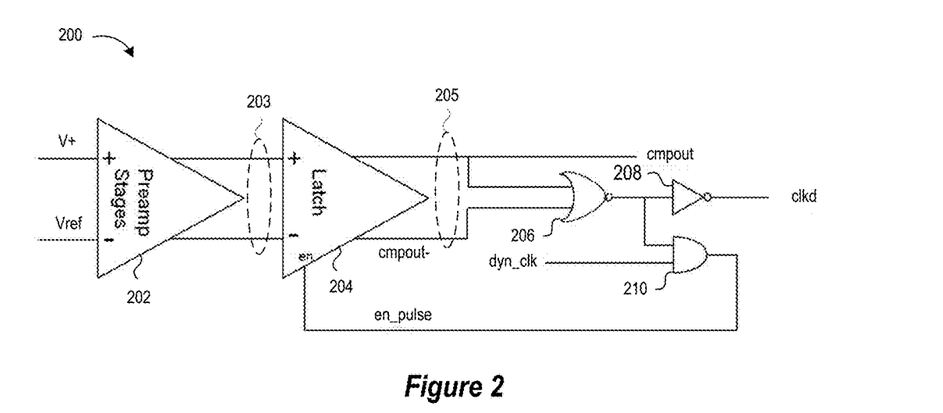
FIG. 2 depicts a schematic circuit diagram of a comparator which may be used in the SAR ADC shown in FIG. 1.

With the outputs from the DACs 102, 104 connected, respectively, as inputs to the non-inverting and inverting terminals, the comparator 106 compares the input voltages V+, Vref to provide a binary output (cmpout) corresponding to each comparison along with a self-generated clock (clkd) to signal the completion of the compare phase at the comparator 106. To provide additional details for an improved understanding of selected embodiments of the present disclosure, reference is now made to FIG. 2 which shows a schematic block circuit diagram of a comparator 200 which includes a preamplifier input stage 202 and a voltage or latch comparator 204. As shown, the preamplifier stage 202 is connected to receive the input voltages V+, Vref and to generate output voltages 203. In addition, the latch comparator 204 is connected to compare the output voltages from the preamplifier stage 202 and to generate therefrom binary outputs 205 (e.g., cmpout, cmpout⁻). In selected embodiments, the comparator 106 is an analog voltage comparator having the desired resolution for the n-bit ADC. In addition, the comparator includes additional clock circuitry for generating an asynchronous, self-generated clock signal (clkd). In selected embodiments, the additional clock circuitry may be implemented with a single OR logic gate functionality that is connected to the binary outputs 205 and embodied with one or more logic circuits. For example, a NOR gate 206 that is connected to compare the binary outputs 205 for output to an inverter circuit 208 may embody the OR gate functionality for generating the self-generated clock signal (clkd). With this distributed OR gate arrangement, an additional AND gate 210 may be connected to compare the output from the NOR gate 206 with the comparator input clock (e.g., dyn_clk) to generate a latch enable signal (en_pulse) for feedback to enable the latch comparator 204.

Referring back to FIG. 1, it can be seen that the output (cmpout) of the comparator 106 and the self-generated clock signal (clkd) are connected to the SAR engine 108 which is configured and arranged to store the binary output (cmpout) provided by the comparator 106 subsequent to each compare phase in response to the ADC input clock (adc_clk). In addition, the SAR engine 108 generates feedback control signals 109 which are connected to control the operation of the DAC 102 during sampling and successive approximation phases of each ADC conversion sequence. For example, each sampling phase of an ADC conversion sequence may be initiated when the SAR engine 108 synchronously sets the sampling control signal (smp) to a first value, and may be ended when the SAR engine 108 synchronously resets the sampling control signal (smp) to a second value. In addition, each successive approximation phase of an ADC conversion sequence may be initiated when the SAR engine 108 synchronously sets the comparison control signal (cmp) to a first value, and may be ended when the SAR engine 108 synchronously resets the comparison control signal (cmp) to a second value. In this way, the SAR engine 108 acts as a sequencer in generating the control signals (smp, cmp) for the DAC 102 to sample the input voltage. After each sample phase is complete, the successive approximation phase of the conversion begins, at which time the SAR engine 108 controls the start of each compare phase by generating and feeding back a synchronous input clock edge (dyn_clk) to the comparator 106. In addition, the SAR engine 108 controls the end of each compare phase (and the beginning of subsequent settling phases) in response to the self-generated clock signal (clkd) from the comparator 106.

As will be appreciated, selected embodiments of the present disclosure may be embodied with differential SAR ADC embodiments in which the first and second digital-to-analog converters (DAC) 102, 104 are replaced with a positive DAC (DAC+) and a negative DAC (DAC−) which are each embodied with capacitor array to respectively provide a positive reference analog voltage V+ and negative reference analog voltage V− to the non-inverting and inverting inputs of a differential comparator 106 which are pre-charged to a common mode voltage (VCM) under control of the feedback comparison control signal (e.g., smp). In the differential ADC embodiments, the positive DAC may include a plurality of binary weighted capacitors that are used to sample a first analog input voltage VIN+ by switching the bottom plates of the first DAC's binary weighted capacitors between a first voltage VREFH, a second voltage VREFL, and first analog input voltage VIN+, where VREFL≤VIN+≤VREFH. Likewise, the negative DAC may include a plurality of binary weighted capacitors that are used to sample a second analog input voltage VIN− by switching the bottom plates of the second DAC's binary weighted capacitors between a first voltage VREFH, a second voltage VREFL, and the second analog input voltage VIN−, where VREFL≤VIN−<VREFH. In this differential arrangement, the first and second DACs are controlled by different sets of feedback control words (e.g., codedep<N-1:0> and codedep_red<M:0> for the first DAC+, and codeden<N-1:0>, and codeden_red<M:0> for the second DAC−) from the SAR engine 108.

Figure 3:
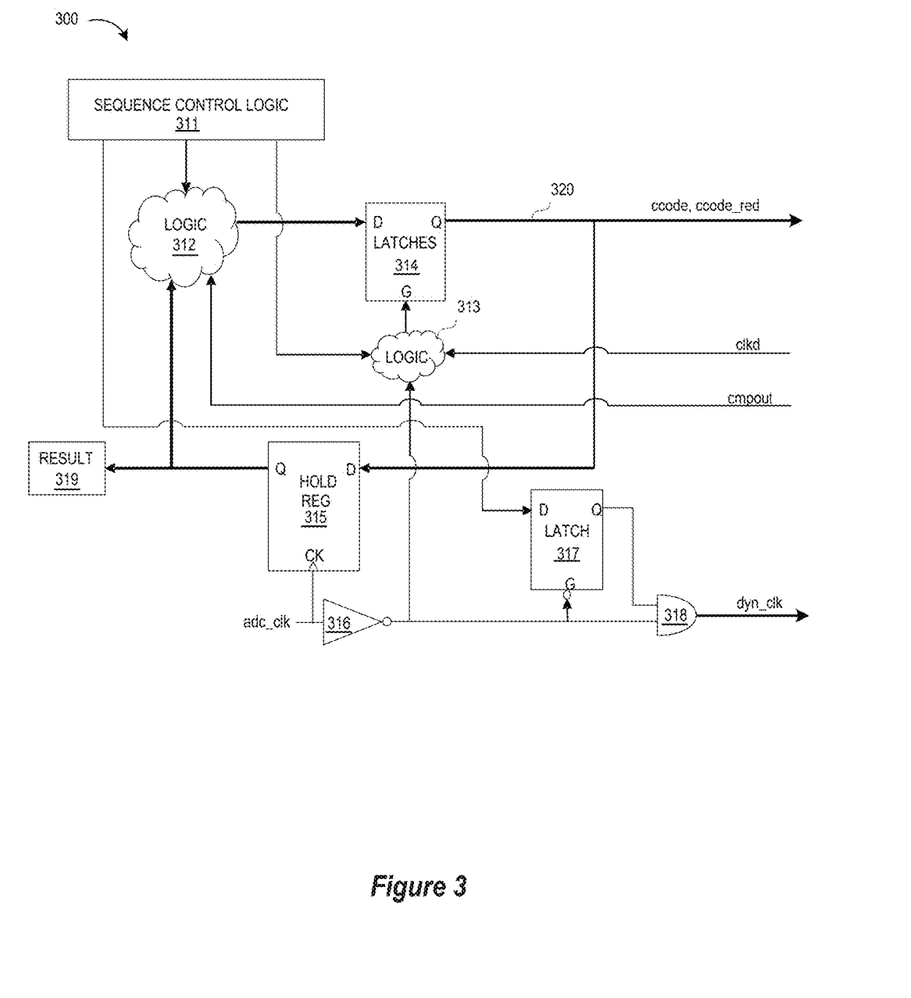
FIG. 3 depicts a schematic block diagram of an SAR engine which may be used in the SAR ADC shown in FIG. 1.

To provide additional details for an improved understanding of selected embodiments of the present disclosure, reference is now made to FIG. 3 which shows a schematic block diagram of an SAR engine 300 which receives as inputs the self-generated clock signal (clkd), the ADC clock (adc_clk), and binary output (cmpout) from the comparator, and generates therefrom the synchronous clock (dyn_clk), along with feedback control signals 320 and the ADC output (RESULT). While any suitable arrangement of circuit elements may be used to implement a SAR state machine for purposes of the present disclosure, the depicted SAR engine 300 includes a plurality of flip-flops or latches which are configured and connected as latches and registers under control of the sequence control logic 311-313 to generate the SAR comparison results and feedback control signals (smp, cmp, etc.), along with the synchronous clock (dyn_clk) for feedback to the comparator where it is logically combined (e.g., with AND gate circuit 210) with an inverted version of the self-generated clock signal (clkd) to asynchronously control the compare phases of the comparator with a latch enable control signal (e.g., en_pulse).

As shown in FIG. 3, the ADC input clock (adc_clk) is connected to clock the SAR engine 300 as a clock input (CK) to a hold register or storage element 315, which may be embodied as a data flip-flop which is triggered by an active edge of the ADC input clock (CK) to hold a received input value (D) from the feedback control signals 320 for output (Q) to the result storage register 319. In addition, the ADC clock input is inverted (via inverter 316) and processed along with the self-generated clock signal (clkd) by the sequence control logic 313 to generate a gate input (G) for a storage register 314 which may be embodied as a D-latch which is connected to receive an input value (D) from the sequence control logic 312 and to generate the feedback control signals 320 at the latch output (Q). The inverted ADC clock input (from inverter 316) is also connected as an inverted gate input (G) for a storage register 317 which may be embodied as a D-latch which is connected to receive an input value (D) from the sequence control logic 311 and to generate an output (Q) in response to the inverted ADC clock input. The inverted ADC input clock (adc_clk) is also provided as a first input to an output AND gate 318 for comparison with the output from the D-latch 317, thereby generating the synchronous output clock (dyn_clk). As described more fully hereinbelow, the sequence control logic 311-313 embodied in the SAR engine 300 is configured to generate input values (D) to the latches 314, 317 and to gate the latch 314 as a function of the logical combination of the self-generated clock signal (clkd), binary output (cmpout), inverted ADC clock input, and the ADC output (RESULT) to generate a synchronous input clock (e.g., dyn_clk) for feedback to the comparator to initiate the compare timing, and to use the asynchronous self-generated clock (e.g., clkd) to end the compare timing and begin the settling time for each successive approximation phase which latches the feedback control signals 320.

Figure 4:
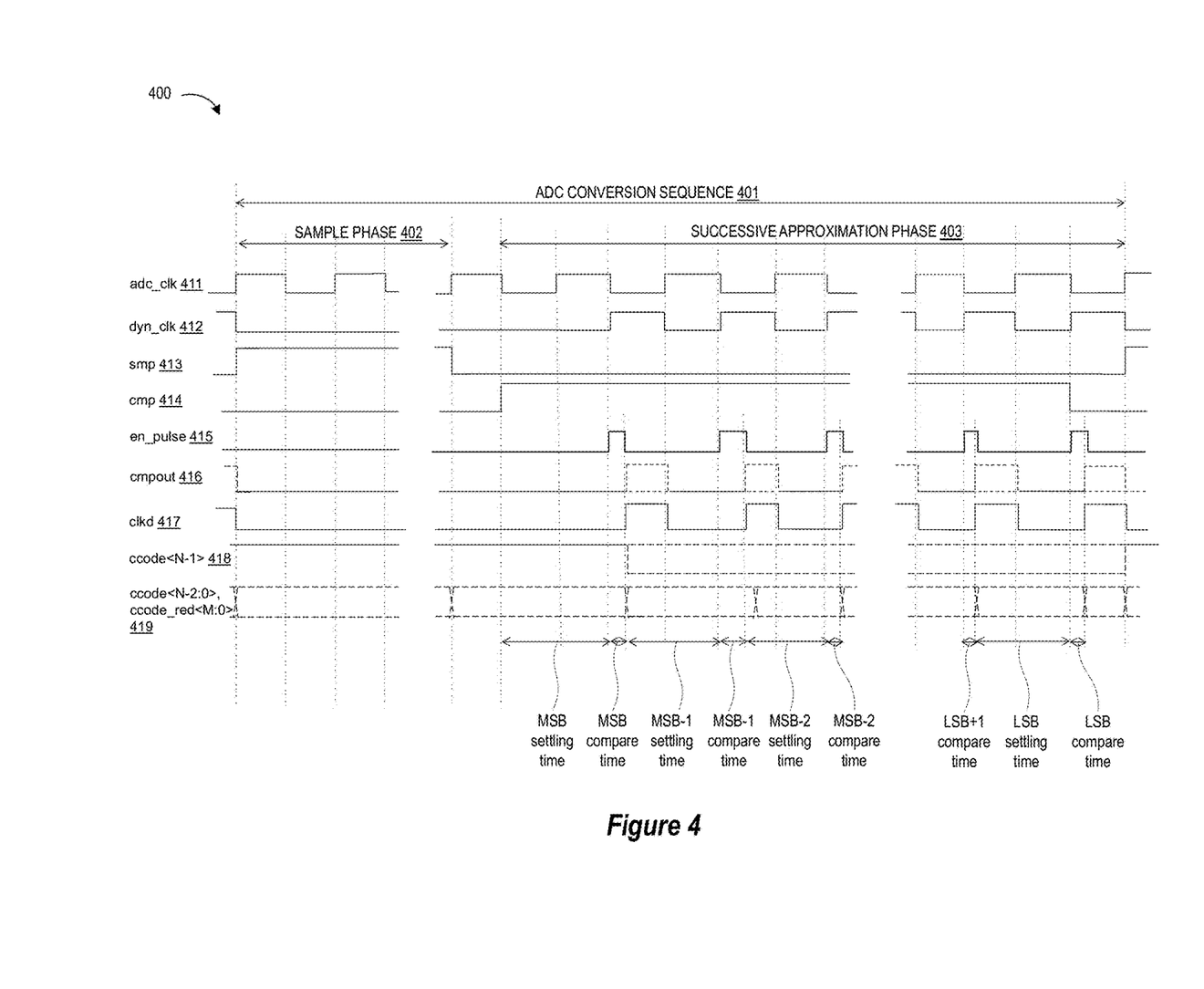
FIG. 4 depicts clocking scheme waveforms for a conversion sequence of a partially synchronous SAR ADC in accordance with selected embodiments of the present disclosure.

To provide additional details for an improved understanding of selected embodiments of the present disclosure, reference is now made to FIG. 4 which depicts clocking scheme waveforms 411-419 for an ADC conversion sequence 401 of a partially synchronous SAR ADC in which a comparator is controlled by a SAR engine which generates a synchronous input clock (dyn_clk) for feedback to the comparator and also generates a output bus (ccode) for each digital bit (MSB:LSB) that is fed back to the DAC (e.g., DAC 102). Each ADC conversion sequence 401 can be separated into a sample phase 402 and a successive approximation phase 403 which includes, for each bit of the multi-bit ADC output, a settling time and a compare time. The settling time for each bit includes a logic delay component (due to delays through the SAR engine's clkd logic 314 and latch clocking delays), a logic delay component (due to delays for binary-to-thermometer encoding or similar delays required to meet linearity requirements), a DAC settling component, and a pre-amp slewing and settling component. The compare time for each bit includes the latch delay and the delay between the comparator's cmpout and clkd outputs. In most cases, the compare time will be significantly faster than the settling time, in which case a conventional synchronous SAR engine that uses the adc_clk high half-period for settling time and the low half-period for comparison time would not be optimal. And while a fully asynchronous SAR engine can be optimized to track the faster compare times, additional circuitry is required to create a settling time delay and to monitor for metastable conditions during the compare time. The partially asynchronous SAR disclosed herein provides a good tradeoff of simplicity and increased speed capability.

As shown in FIG. 4, the sample phase 402 of the ADC conversion sequence 401 occurs when the sampling control signal 413 (smp) is asserted or set, during which time the ADC samples the analog input voltage. When the sampling control signal 413 (smp) is deasserted or reset, the sampling phase 402 ends, and the comparison control signal 414 (cmp) is asserted or set to begin the successive approximation phase 403. In particular, the initial setting of the comparison control signal 414 begins the settling phase for the most significant bit (MSB), at which point the ADC input clock 411 is processed at the latches of the SAR engine to begin generating the synchronous clock 412 (dyn_clk) for the successive approximation phase 402. When fed back to the comparator, the synchronous clock 412 (dyn_clk) is logically combined (e.g., with AND gate circuit 210) with an inverted version of the self-generated clock signal 417 (clkd) to generate a latch enable control signal 415 (en_pulse) which asynchronously controls the compare phases of the comparator after each settling phase. For the purposes of the present disclosure, the logic delays, DAC settling, and pre-amp settling are all lumped together into the "settling time" phases.

For the initial settling phase for the most significant bit (MSB), the settling time is initiated by the rising edge of the comparison control signal 414 (cmp) and ended by the synchronous rising edge of the latch enable control signal 415 (en_pulse), and the MSB compare time is initiated by the synchronous rising edge of the latch enable control signal 415 (en_pulse) and ended by the asynchronous falling edge of the latch enable control signal 415 (en_pulse). Stated another way, the MSB compare time ends with the rising edge of the synchronous clock 412 (dyn_clk) since it has virtual identical timing with the latch enable control signal 415 (en_pulse). The captured bus code result for the most significant bit 418 (ccode<N-1>) is then captured before proceeding to the settling phase for the next most significant bit (e.g., MSB-1). And for each subsequent settling phase, the settling time (e.g., MSB-1 settling time) is initiated by the asynchronous rising edge of the self-generated clock 417 (clkd) generated by the comparator and ended by the synchronous rising edge of the self-generated clock edge 415

(en_pulse), and the compare time (e.g., MSB-1 compare time) is initiated by the synchronous rising edge of the latch enable control signal 415 (en_pulse) and ended by the asynchronous falling edge of the latch enable control signal 415 (en_pulse) (or the falling edge of the synchronous clock 412 (dyn_clk)), with the corresponding bus code results 419 (ccode<N-2:0>) being captured. For a 12 bit ADC, the bus code results captured in the waveforms 418-419 would be ccode[11:0].

For a redundant ADC, the SAR engine also generates feedback control signals for the redundant capacitors in the DAC (e.g., 102) as indicated in the "ccode_red" waveform 419. These redundant control signals may include 2 or 3 signals that adjust the redundancy offset and control the DAC to do additional approximation steps. For example, with one redundant bit in a 12 b ADC placed at bit 6, redundancy offset equal to bit 5 would be asserted at the start of the successive approximation phase, in which case a normal approximation sequence would be performed from MSB through bit 6, and the redundancy offset would be removed to perform an additional approximation with the redundant bit (equal weight to bit 6) before continuing with the normal approximation sequence on bits 5 to 0. When the comparison control signal 414 (cmp) is deasserted or reset, the successive approximation phase 403 ends, and the sampling control signal 413 (snip) is re-asserted or set to begin the next sampling phase 402.

As demonstrated by the clocking scheme waveforms 411-419, the partially asynchronous SAR ADC SAR engine disclosed herein uses the ADC input clock 411 (adc_clk) period to time the sample phase sequence 402 but uses the self-generated clock 417 (clkd) to time the successive approximation phase sequence 403. In particular, the MSB bit comparison begins once the comparison control signal 414 (cmp) is asserted so that the MSB is the only bit that gets a full ADC input clock period to settle prior to comparison. For MSB-1 to LSB periods, the settling time for the DAC would be what's left of the period after the previous comparison is complete. To this end, the ADC input clock 411 (adc_clk) is used to generate a synchronous comparator clock 412 (dyn_clk) for the successive approximation phase 403 of each ADC conversion sequence 401, where the rising edge of the synchronous comparator 412 (dyn_clk) is used to trigger the start of a bit comparison. Once completed, the comparator generates its comparator output 416 (cmpout) plus a self-generated clock edge 417 (clkd) to signal the end of the compare phase. On the rising clock edge 417 (clkd), the comparator output is stored and the DAC input codes are configured for the next bit approximation which starts the DAC settling time for the next cycle. When the last bit comparison is complete (LSB compare time is done), the conversion is complete and the next conversion would start on the subsequent rising edge of adc_clk. For example if the MSB comparison took ¼ the clock period, the MSB-1 would have ¾ of the period to settle. The comparison time is always initiated by the ADC input clock 411 (adc_clk) (by way of dyn_clk rising edge). The comparison end time is asynchronous. The comparator itself tells the SAR engine when it is done comparing by asserting the self-generated clock 417 signal (clkd). The comparison time is typically proportional to the voltage difference of the latch inputs. When the SAR engine sees the rising edge of the self-generated clock 417 signal (clkd), it captures and stores the comparator output 416 (cmpout) and then computes and updates the ccode value 418-419 which will adjust the DAC voltages for the next bit. The remaining portion of the period will allow DAC settling of the new voltages and then another comparison will be triggered by the synchronous clock 412 (dyn_clk). Once all the bits have been determined, the conversion is complete. While the result is known once the LSB comparison is done, it will not be visible until the next rising edge of the ADC input clock 411 (adc_clk) because all ADC digital circuits outside the SAR engine are timed only by the ADC input clock 411. As will be appreciated, implementations with redundancy will require more hit comparisons than the resolution of the ADC. For example 14 bit comparisons may be required for a 12 b ADC result.

In contrast, a conventional SAR engine would use the ADC input clock period for each bit comparison during the successive approximation phase sequence, with the high half-period of the ADC input clock being used for the settling phase and the low half-period of the ADC input clock being used for the comparison phase. After each comparison result, the conventional SAR engine would calculate a new value of ccode for updating the DAC, and the comparator inputs would settle to new values. After all hits are approximated, the conversion is complete and the sequence of comparator outputs 418-419 define the result. With this rigid compare phase clocking scheme, conventional SAR engines have the disadvantage of requiring fixed DAC settling time and fixed compare times.

While the disclosed partially synchronous SAR clocking scheme has speed and design efficiencies that may be used with any desired SAR ADC, the clocking scheme may be advantageously employed with high-resolution (≥12 b), medium speed (<10 Ms/s) SAR ADCs, especially those with built-in redundancy, including SAR ADCs in MCUs for general purpose applications. Indeed, the disclosed clocking scheme provides unexpected performance improvement results in view of the comparator metastability errors that arise with high-speed asynchronous ADCs having transient conditions in its logic circuits. In particular, in cases where the ADC's comparator input is very near zero, the comparison time can become very long, creating problematic delays with asynchronous clocking schemes where there is no time limit. To address this situation, existing ADCs typically require additional analog delay circuitry to act as a timeout for the comparison. However, the partially synchronous SAR clocking scheme of the present disclosure effectively includes a built-in timeout which inherently detects and handles metastable conditions when the self-generated clock edge does not come before the next input clock edge.

Figure 5:
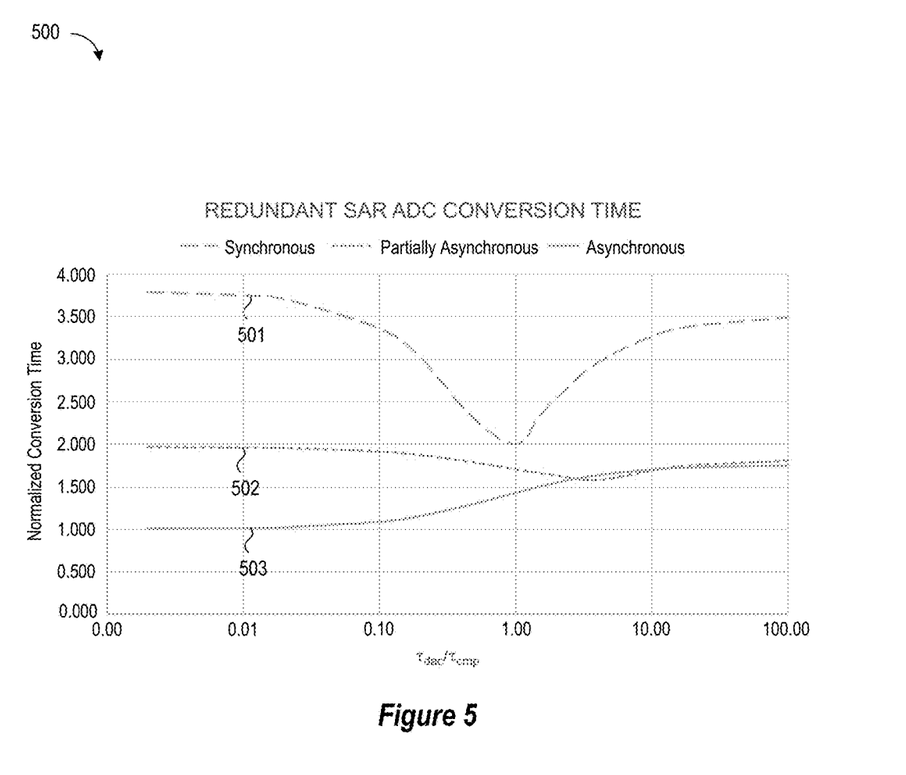
FIG. 5 is a plot of conversion rates that are normalized to the minimum conversion rate which is the sum of all required settling and compare times.

Most modern SAR ADCs contain built-in redundancy that will overcome errors due to settling, noise, or metastability. Optimal redundancy schemes allow for larger errors in the early bit comparisons, smaller errors in the middle bit comparisons, and then typically have little or no redundancy for the least significant bit comparisons. If a slow comparison happens in the early bits, the large amount of redundancy will alleviate the settling on the large DAC voltage swing of the next bit. And if slow comparison happens in the middle bits, the smaller redundancy will be enough because the DAC voltage swings are low. Finally, if the slow comparison happens in the non-redundant bits, the DAC voltage swing is so small that the settling time will be fast (much less than one-half clock cycle). To illustrate the effectiveness of the disclosed partially asynchronous clocking scheme in a redundant SAR ADC, reference is now made to FIG. 5 which is a plot 500 of conversion rates for a synchronous clocking scheme 501, a partially synchronous clocking scheme 502, and an asynchronous clocking scheme 403, where the conversion rates are normalized to the minimum conversion rate which is the sum of all required settling and compare times. As seen in the plot when DAC settling time (which includes logic delays and preamp settling) dominates, the partially asynchronous scheme 502 becomes just as effective as the asynchronous scheme 503 with fixed DAC delay and considerably better than the fully synchronous clocking scheme 501.

Figure 6:
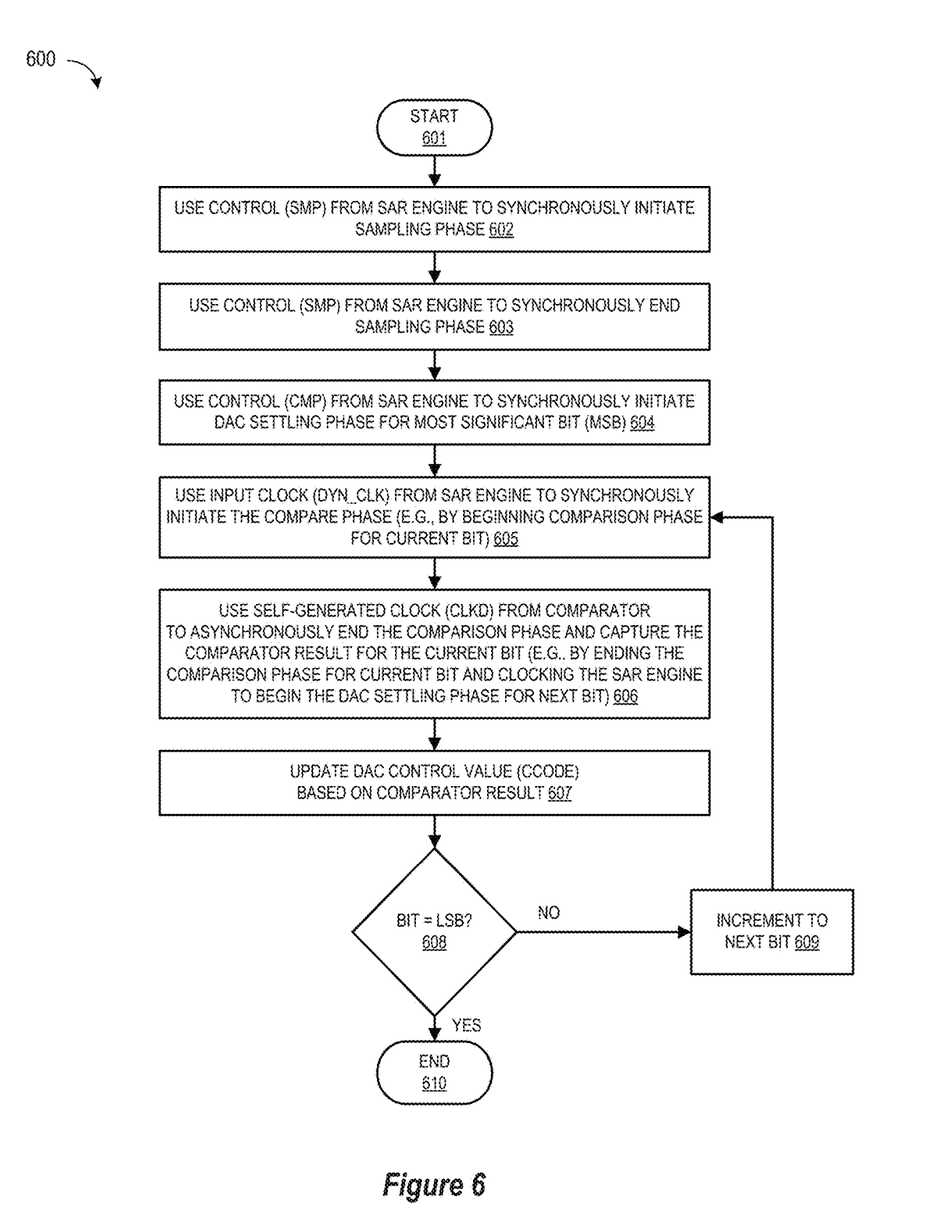
FIG. 6 illustrates a simplified flow chart showing the logic for a partially synchronous SAR ADC conversion in accordance with a first selected embodiment of the present disclosure which does not use redundancy.

To provide additional details for an improved understanding of selected first embodiments of the present disclosure, reference is now made to FIG. 6 which depicts a simplified flow chart 600 showing the logic for a partially synchronous SAR ADC conversion process in which redundancy is not used. In an example embodiment, the processing shown in FIG. 6 may be performed at an SAR ADC with an SAR engine embodied with dedicated hardware, software, or hybrid implementations and configured for controlling the SAR DAC and comparator with feedback control signals by using an asynchronous self-generated clock edge (clkd) to initiate the DAC settling phase and using a synchronous input clock edge (dyn_clk) to initiate the comparator compare phase without requiring complex analog delay cells.

At step 601, the methodology starts with the control logic and/or hardware at the SAR engine which is configured to generate a sampling control signal (smp) which synchronously initiates the sampling phase (step 602). With reference to the example embodiments shown in FIG. 1-3, the sequence control logic 311 may be used to set the sampling control signal 109 for feedback to the DAC 102. At step 603, sequence control logic 311 in the SAR engine 300 may be configured to reset the sampling control signal (smp) to synchronously end the sampling phase, such as by using the sequence control logic 311 to reset the sampling control signal for feedback to the DAC 102.

At step 604, the SAR engine may be configured to generate a compare control signal (cmp) which is fed back to the DAC at the start of the successive approximation phase to synchronously initiate the DAC settling phase for the most significant bit. With reference to the example embodiments shown in FIG. 1-3, the sequence control logic 311 may be used to synchronously initiate the DAC settling phase by setting the compare control signal (cmp) for feedback to the DAC 102. At step 605, the SAR engine may be configured to generate an input clock (dyn_clk) for feedback to the comparator to synchronously initiate the compare phase for the current bit, such as by using the sequence control logic 311 to control the D-latch 317 that is logically combined with the inverted ADC input clock at the AND gate 318 to generate the input clock (dyn_clk) for feedback to the comparator 106. At the comparator 200, the input clock (dyn_clk) may be logically combined with an inverted version of the asynchronous self-generated clock (e.g., clkd) at the AND gate 210 to generate the latch enable signal (en_pulse) for enabling the latch comparator 204.

At step 606, the comparator issues the self-generated clock (e.g., clkd) to asynchronously end the comparison phase and cause SAR engine 108 to capture the comparator result for the current hit. With reference to the example embodiments shown in FIG. 1-3, the comparator 200 ends the comparison phase when the input clock (dyn_clk) and inverted version of the asynchronous self-generated clock (e.g., clkd) are combined at the AND gate 210 to disable the latch enable signal (en_pulse) to the latch comparator 204, thereby asynchronously ending the comparison phase for the current bit. In addition, the D-latch control logic 313 in the SAR engine 300 may be configured to process the self-generated clock (e.g., clkd) from the comparator 200 to begin the DAC settling phase for the next bit by clocking the D-latch 314 in the SAR engine 300.

At step 607, the SAR engine updates the DAC control values (ccode, ccode_red) based on the comparator results, at which point it is determined if the DAC control values for the least significant bit (LSB) have been determined (step 608). If not (negative outcome to decision 608), the next most significant bit is selected or incremented (step 609), and the steps 605-607 are iteratively repeated until the DAC control codes for the least significant bit are updated (affirmative outcome to decision 608), at which point the processing ends (step 610).

Figure 7:
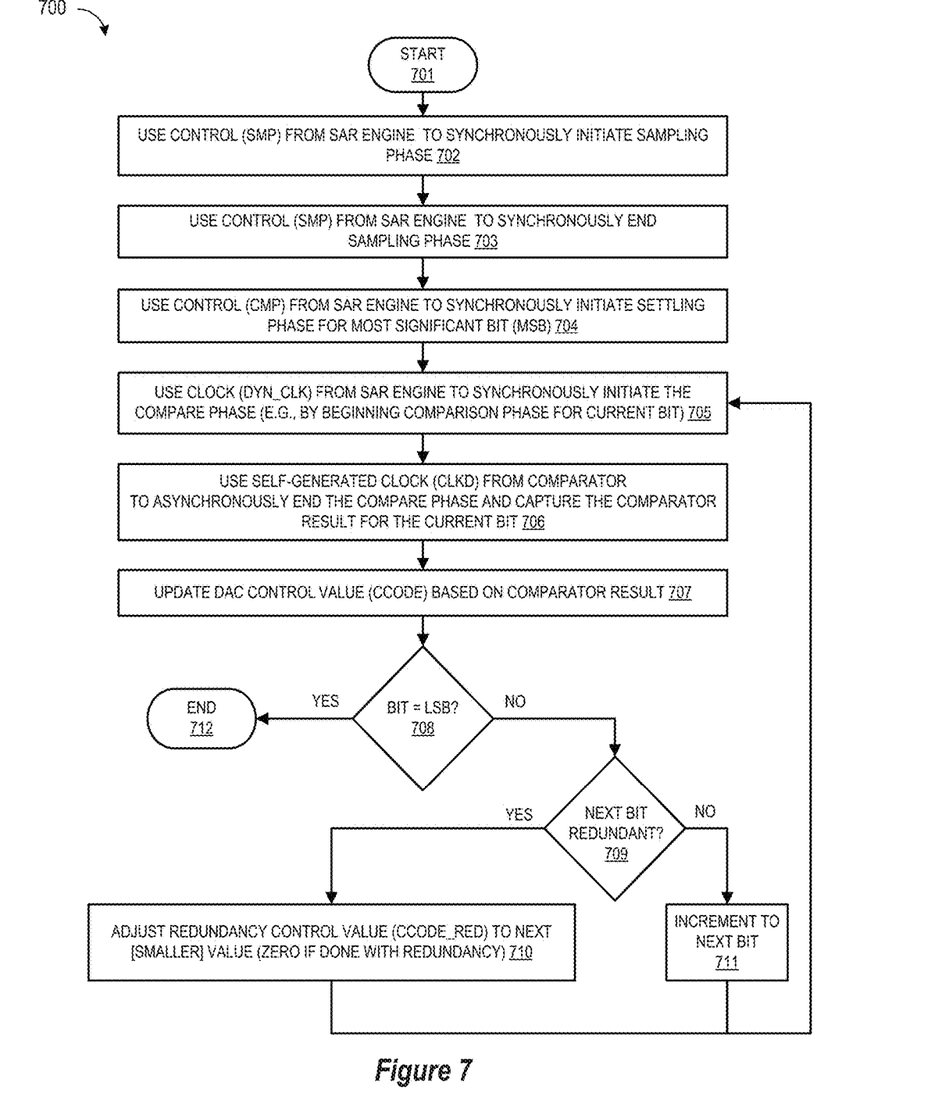
FIG. 7 illustrates a simplified flow chart showing the logic for a partially synchronous SAR ADC conversion in accordance with a second selected embodiment of the present disclosure which does use redundancy.

To provide additional details for an improved understanding of selected second embodiments of the present disclosure, reference is now made to FIG. 7 which depicts a simplified flow chart 700 showing the logic for a partially synchronous SAR ADC conversion process which does use redundancy. As will be appreciated, the processing shown in FIG. 7 may be performed at an SAR ADC with an SAR engine embodied with dedicated hardware, software, or hybrid implementations and configured for controlling the SAR DAC and comparator with feedback control signals by using an asynchronous self-generated clock edge (clkd) to initiate the DAC settling phase and using a synchronous input clock edge (dyn_clk) to initiate the comparator compare phase without requiring complex analog delay cells.

At step 701, the methodology starts when the SAR engine generates a sampling control signal (smp) which synchronously initiates the sampling phase (step 702). As disclosed herein, step 702 may be implemented with sequence control logic at the SAR engine which sets the sampling control signal for feedback to the DAC. At step 703, the sampling control signal (smp) from the SAR engine is used to synchronously end the sampling phase, such as by using the sequence control logic to reset the sampling control signal for feedback to the DAC.

At step 704, the SAR engine may be configured to generate a compare control signal (cmp) which is fed back to the DAC at the start of the successive approximation phase to synchronously initiate the DAC settling phase for the most significant bit. As disclosed herein, step 704 may be implemented with sequence control logic at the SAR engine which sets the compare control signal (cmp) for feedback to the DAC. At step 705, the SAR engine may be configured to generate an input clock (dyn_clk) for feedback to the comparator to synchronously initiate the compare phase for the current bit. With reference to the example embodiments shown in FIG. 1-3, step 705 may be implemented by using the sequence control logic 311 to generate an input for the D-latch 317 having an output that is logically combined with the inverted ADC input clock at the AND gate 318 to generate the input clock (dyn_clk) for feedback to the comparator 200 where it is logically combined with an inverted version of the asynchronous self-generated clock (e.g., clkd) at the AND gate 210 to generate the latch enable signal (en_pulse) for enabling the latch comparator 204.

At step 706, the comparator issues the self-generated clock (e.g., clkd) to asynchronously end the comparison phase and cause SAR engine 108 to capture the comparator result for the current bit. With reference to the example embodiments shown in FIG. 1-3, the comparator 200 ends the comparison phase when the input clock (dyn_clk) and inverted version of the asynchronous self-generated clock (e.g., clkd) are combined at the AND gate 210 to disable the latch enable signal (en_pulse) to the latch comparator 204, thereby asynchronously ending the comparison phase for the current bit.

At step 707, the SAR engine updates the DAC control values (ccode, ccode_red) based on the comparator results, at which point it is determined if the DAC control values for the least significant bit (LSB) have been determined (step 708). If not (negative outcome to decision 708), it is determined in the next bit is a redundant bit (step 709). If not (negative outcome to decision 709), then the next most significant bit is selected or incremented (step 711), and the steps 705-707 are iteratively repeated until a redundant bit is reached (affirmative outcome to decision 709), at which time the redundancy control code (ccode_red) is adjusted at step 710 to the next (smaller) value (or to zero if done with redundancy) before continuing (without incrementing to the next bit) to iteratively repeat steps 705-711 until the lease significant bit is reached (affirmative outcome to decision 708), at which point the processing ends (step 712).

As disclosed herein, the disclosed method, system, and apparatus for performing SAR ADC conversion may be implemented with a successive approximation register engine embodied with dedicated hardware, software, or hybrid implementations that is connected and controlled by control logic and/or computer program product having program code portions for performing steps of a method and/or for performing functions of a device or system in which a partially asynchronous SAR ADC clocking scheme uses asynchronous compare times within a fixed period for the "compare time plus DAC settling time" to increase the ADC conversion speed without requiring analog delay circuitry. Although embodiments are described in the context of using an example SAR engine to generate a synchronous comparator input clock (e.g., dyn_clk) to end the settling time and initiate the compare timing and using an example comparator to generate asynchronous self-generated clock edges (e.g., clkd) to end the compare timing and begin the settling time, the proposed SAR ADC computation method, system, and apparatus may used any desired configuration of control logic, latches, and registers to generate and apply the clock signals. For example, although FIGS. 2-3 and the discussion thereof describe an exemplary SAR ADC architecture to implement clocking signals for a partially asynchronous SAR ADC, this exemplary architecture is presented merely to provide a useful reference in discussing various aspects of the invention. Of course, the description of the architecture has been simplified for purposes of discussion, and it is just one of many different types of appropriate architectures that may be used in accordance with the invention.

Those skilled in the art will recognize that the boundaries between logic blocks and circuit elements are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there has been provided an apparatus, method, program code, and system for controlling a successive approximation register (SAR) analog-to-digital converter (ADC). In the disclosed apparatus, method, program code, and system, a first control signal (smp) is generated to control sampling of an analog input voltage at a digital-to-analog converter (DAC). In addition, a second control signal (cmp) is generated to start a successive approximation sequence at a comparator and SAR engine to convert the analog input voltage to an N-bit digital value. Once started, the successive approximation sequence includes a settling phase and a comparison phase for each bit of the N-bit digital value. In particular, each settling phase is controlled to allow for DAC settling, SAR engine logic settling, and preamp settling so as to synchronously end in response to a first synchronous clock signal (dyn_clk) that is derived from an ADC input clock. In addition, each comparison phase is controlled to allow for comparison of the analog input voltage to a reference voltage so as to synchronously start in response to the first synchronous clock signal (dyn_clk) and asynchronously end in response to a second asynchronous clock signal (clkd) that is self-generated by the comparator. For example, a first settling phase for a most significant bit of the N-bit digital value is controlled to synchronously start in response to the second control signal (cmp) being set, and a first comparison phase for the most significant bit of the N-bit digital value is controlled to synchronously start in response to the first synchronous clock signal (dyn_clk) being set while the second asynchronous clock signal (clkd) is reset, and is controlled to asynchronously end in response to the second asynchronous clock signal (clkd) being set. Subsequently, a second settling phase for a next most significant bit of the N-bit digital value is controlled to asynchronously start in response to the first synchronous clock signal (dyn_clk) and the second asynchronous clock signal (clkd) both being set, and a second comparison phase for the next most significant bit of the N-bit digital value is controlled to be synchronously started in response to the first synchronous clock signal (dyn_clk) being set while the second asynchronous clock signal (clkd) is reset, and is asynchronously ended in response to the first synchronous clock signal (dyn_clk) and the second asynchronous clock signal (clkd) both being set. In selected embodiments, the first synchronous clock signal (dyn_clk) is generated by the SAR engine for feedback to the comparator which generates the second asynchronous clock signal (clkd) for input to the SAR engine which is connected and configured to use one or the other of the ADC input clock and second asynchronous clock signal to generate control signals and DAC input codes to the DAC. In such embodiments, each rising edge of the second asynchronous clock signal stores an output from the comparator at the SAR engine which configures DAC input codes for the next bit approximation which starts the settling phase for a next most significant bit.

In another form, there is provided a method, apparatus, and system for converting an analog signal to a digital signal using a digital-to-analog converter (DAC), a comparator, and a successive approximation register (SAR) control circuit. As disclosed, the comparator is coupled to compare an output associated with the DAC to a reference, thereby generating a comparator output. In selected embodiments, the comparator includes a logical OR gate coupled to received differential comparator outputs from a latched comparator for generating the asynchronous clock signal (clkd). In other embodiments, the logical OR gate may be embodied with a logical NOR gate connected to an inverter, where an output of the logical NOR gate may be coupled for combination with the synchronous clock signal (dyn_clk) at a logical AND gate to form a latch enable signal for the latched comparator. Thus coupled, the comparator also generates an asynchronous clock signal (clkd) in response to the comparator output and a synchronous clock signal (dyn_clk). In addition, the SAR control circuit is coupled to receive the comparator output and asynchronous clock signal (clkd) from the comparator and to generate the synchronous clock signal (dyn_clk) for feedback to the comparator. Thus coupled, the SAR control circuit is operable to, for a first bit value of an N-bit digital signal, start a successive approximation sequence for converting an analog signal to an N-bit digital signal. The disclosed successive approximation sequence for the first bit value includes a settling phase and a comparison phase. The settling phase allows for settling of the DAC, comparator, and SAR control circuit so as to synchronously end in response to the synchronous clock signal (dyn_clk). And the comparison phase for the first bit value allows for comparison of the analog signal to a reference voltage so as to synchronously start in response to the synchronous clock signal (dyn_clk) and asynchronously end in response to the asynchronous clock signal (clkd). With the disclosed system, a partially synchronous clocking scheme is applied so that each settling phase is controlled to asynchronously start in response to the synchronous clock signal (dyn_clk) and the asynchronous clock signal (clkd) both being set, and so that each comparison phase is controlled to be synchronously started in response to the synchronous clock signal (dyn_clk) being set while the asynchronous clock signal (clkd) is reset, and to be asynchronously ended in response to the synchronous clock signal (dyn_clk) and the asynchronous clock signal (clkd) both being set. In selected embodiments, each rising edge of the asynchronous clock signal stores an output from the comparator at the SAR control circuit which configures DAC input codes for a next hit approximation which starts a settling phase for a next most significant bit. In this way, each bit value of a plurality of bit values of the N-bit digital signal may be processed with a settling phase and a comparison phase of the successive approximation sequence for converting the analog signal to an N-bit digital signal.

In yet another form, there is provided a partially synchronous successive approximation analog-to-digital converter (ADC) for converting an analog input signal to an N-bit digital value using a digital-to-analog converter (DAC), a comparator, and a successive approximation register (SAR) engine. As disclosed, the DAC converts a digital signal to a reference analog voltage. In selected embodiments, the DAC is a single-ended DAC or a differential DAC. In addition, the comparator compares the analog input signal with the reference analog voltage and correspondingly generates a comparator output and for generating an asynchronous clock signal (clkd) in response to the comparator output and a synchronous clock signal (dyn_clk). In selected embodiments, the comparator may include a preamplifier coupled to receive the analog input signal and the reference analog voltage for generating amplified output voltages, a latched comparator coupled to receive the amplified output voltages for generating differential comparator outputs, and a logical OR gate coupled to receive the differential comparator outputs for generating the asynchronous clock signal (clkd).

In addition, the logical OR gate may be embodied with a logical NOR gate connected to an inverter, with an output of the logical NOR gate coupled for combination with the synchronous clock signal (dyn_clk) at a logical AND gate to form a latch enable signal for the latched comparator. Finally, the disclosed SAR engine generates the synchronous clock signal (dyn_clk) for feedback to the comparator and also updates the digital signal according to the comparator output for each bit of the N-bit digital signal using a settling phase and comparison phase for each bit of the N-bit digital value, where each settling phase synchronously ends in response to the synchronous clock signal (dyn_clk) to allow for settling of the DAC, comparator, and SAR engine, and where each comparison phase synchronously starts in response to the synchronous clock signal (dyn_clk) and asynchronously ends in response to the asynchronous clock signal (clkd) to allow for comparison of the analog input signal to the reference analog voltage. With the disclosed partially synchronous ADC, a clocking scheme is applied so that each settling phase is controlled to asynchronously start in response to the synchronous clock signal (dyn_clk) and the asynchronous clock signal (clkd) both being set, and each comparison phase is controlled to be synchronously started in response to the synchronous clock signal (dyn_clk) being set while the asynchronous clock signal (clkd) is reset, and to be asynchronously ended in response to the synchronous clock signal (dyn_clk) and the asynchronous clock signal (clkd) both being set. In selected embodiments, each rising edge of the asynchronous clock signal stores an output from the comparator at the SAR engine which configures DAC input codes for a next bit approximation which starts a settling phase for a next most significant bit. And to generate the partially synchronous clocking scheme, the SAR engine may include a logical AND gate for combining an inverted ADC input clock with a latched control signal generated by sequential control logic to generate the synchronous clock signal (dyn_clk).

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary SAR engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A control method for a successive approximation register (SAR) analog-to-digital converter (ADC), comprising:
    generating a first control signal to control sampling of an analog input voltage at a digital-to-analog converter (DAC); and
    generating a second control signal to start a successive approximation sequence at a comparator and SAR engine to convert the analog input voltage to an N-bit digital value, where the successive approximation sequence comprises:
    a settling phase for each bit of the N-bit digital value to allow for DAC settling, SAR engine logic settling, and comparator settling, where each settling phase is controlled to synchronously end in response to a first synchronous clock signal that is derived from an ADC input clock, and
    a comparison phase for each bit of the N-bit digital value to allow for comparison of the analog input voltage to a reference voltage, where each comparison phase is controlled to synchronously start in response to the first synchronous clock signal and asynchronously end in response to a second asynchronous clock signal that is self-generated by the comparator.

2. The control method of claim 1, where a first settling phase for a most significant bit of the N-bit digital value is controlled to synchronously start in response to the second control signal (cmp) being set, and where a first comparison phase for the most significant bit of the N-bit digital value is controlled to synchronously start in response to the first synchronous clock signal (dyn_clk) being set while the second asynchronous clock signal (clkd) is reset, and is controlled to asynchronously end in response to the second asynchronous clock signal (clkd) being set.

3. The control method of claim 2, where a second settling phase for a next most significant bit of the N-bit digital value is controlled to asynchronously start in response to the first synchronous clock signal (dyn_clk) and the second asynchronous clock signal (clkd) both being set, and where a second comparison phase for the next most significant bit of the N-bit digital value is controlled to be synchronously started in response to the first synchronous clock signal (dyn_clk) being set while the second asynchronous clock signal (clkd) is reset, and is asynchronously ended in response to the first synchronous clock signal (dyn_clk) and the second asynchronous clock signal (clkd) both being set.

4. The control method of claim 1, where the first synchronous clock signal (dyn_clk) is generated by the SAR engine for feedback to the comparator.

5. The control method of claim 4, where the second asynchronous clock signal (clkd) is generated by the comparator for input to the SAR engine.

6. The control method of claim 5, where SAR engine receives the ADC input clock and second asynchronous clock signal and uses one or the other to generate control signals and DAC input codes to the DAC.

7. The control method of claim 6, where each rising edge of the second asynchronous clock signal stores an output from the comparator at the SAR engine which configures DAC input codes for the next bit approximation which starts the settling phase for a next most significant bit.

8. A system for converting an analog signal to a digital signal, the system comprising:
    digital-to-analog converter (DAC);
    a comparator coupled to compare an output associated with the DAC to a reference for generating a comparator output and for generating a self-generated asynchronous clock signal (clkd) in response to the comparator output and a synchronous clock signal (dyn_clk); and
    a successive approximation register (SAR) control circuit coupled to receive the comparator output and asynchronous clock signal (clkd) from the comparator and to generate the synchronous clock signal (dyn_clk) for feedback to the comparator, the SAR control circuit operable to, for a first bit value of an N-bit digital signal, start a successive approximation sequence for converting an analog signal to an N-bit digital signal, where the successive approximation sequence comprises:
    a settling phase for the first bit value to allow for settling of the DAC, comparator, and SAR control circuit so as to synchronously end in response to the synchronous clock signal (dyn_clk), and
    a comparison phase for the first bit value to allow for comparison of the analog signal to a reference voltage so as to synchronously start in response to the synchronous clock signal (dyn_clk) and asynchronously end in response to the asynchronous clock signal (clkd).

9. The system of claim 8, where each bit value of a plurality of bit values of the N-bit digital signal is processed with a settling phase and a comparison phase of the successive approximation sequence for converting the analog signal to an N-bit digital signal.

10. The system of claim 8, where the comparator comprises a logical OR gate coupled to received differential comparator outputs from a latched comparator for generating the asynchronous clock signal (clkd).

11. The system of claim 10, where the logical OR gate comprises a logical NOR gate connected to an inverter, with an output of the logical NOR gate coupled for combination with the synchronous clock signal (dyn_clk) at a logical AND gate to form a latch enable signal for the latched comparator.

12. The system of claim 11, where each settling phase is controlled to asynchronously start in response to the synchronous clock signal (dyn_clk) and the asynchronous clock signal (clkd) both being set, and where each comparison phase is controlled to be synchronously started in response to the synchronous clock signal (dyn_clk) being set while the asynchronous clock signal (clkd) is reset, and to be asynchronously ended in response to the synchronous clock signal (dyn_clk) and the asynchronous clock signal (clkd) both being set.

13. The system of claim 12, where each rising edge of the asynchronous clock signal stores an output from the comparator at the SAR control circuit which configures DAC input codes for a next bit approximation which starts a settling phase for a next most significant bit.

14. A partially synchronous successive approximation analog-to-digital converter (ADC) for converting an analog input signal to an N-bit digital value, comprising:
   a digital-to-analog converter (DAC) for converting a digital signal to a reference analog voltage;
   a comparator for comparing the analog input signal with the reference analog voltage and correspondingly generating a comparator output and for generating an asynchronous clock signal (clkd) in response to the comparator output and a synchronous clock signal (dyn_clk); and
   a successive approximation register (SAR) engine for generating the synchronous clock signal (dyn_clk) for feedback to the comparator and for updating the digital signal according to the comparator output for each bit of the N-bit digital signal using a settling phase and comparison phase for each bit of the N-bit digital value, where each settling phase synchronously ends in response to the synchronous clock signal (dyn_clk) to allow for settling of the DAC, comparator, and SAR engine, and where each comparison phase synchronously starts in response to the synchronous clock signal (dyn_clk) and asynchronously ends in response to the asynchronous clock signal (clkd) to allow for comparison of the analog input signal to the reference analog voltage.

15. The partially synchronous successive approximation ADC of claim 14, where comparator comprises:
   a preamplifier coupled to receive the analog input signal and the reference analog voltage for generating amplified output voltages;
   a latched comparator coupled to receive the amplified output voltages for generating differential comparator outputs; and
   a logical OR gate coupled to receive the differential comparator outputs for generating the asynchronous clock signal (clkd).

16. The partially synchronous successive approximation ADC of claim 15, where the logical OR gate comprises a logical NOR gate connected to an inverter, with an output of the logical NOR gate coupled for combination with the synchronous clock signal (dyn_clk) at a logical AND gate to form a latch enable signal for the latched comparator.

17. The partially synchronous successive approximation ADC of claim 16, where each settling phase is controlled to asynchronously start in response to the synchronous clock signal (dyn_clk) and the asynchronous clock signal (clkd) both being set, and where each comparison phase is controlled to be synchronously started in response to the synchronous clock signal (dyn_clk) being set while the asynchronous clock signal (clkd) is reset, and to be asynchronously ended in response to the synchronous clock signal (dyn_clk) and the asynchronous clock signal (clkd) both being set.

18. The partially synchronous successive approximation ADC of claim 14, where the SAR engine comprises a logical AND gate for combining an inverted ADC input clock with a latched control signal generated by sequential control logic to generate the synchronous clock signal (dyn_clk).

19. The partially synchronous successive approximation ADC of claim 14, wherein the DAC is a single-ended DAC.

20. The partially synchronous successive approximation ADC of claim 14, further comprising a second digital-to-analog converter (DAC) for converting a second digital signal to a second reference analog voltage, where the second DAC is connected to the comparator to form a differential ADC.

* * * * *